(12) United States Patent
Kawaguchi et al.

(10) Patent No.: US 9,301,398 B2
(45) Date of Patent: Mar. 29, 2016

(54) TRANSPARENT CONDUCTIVE FILM

(75) Inventors: Yasuhiro Kawaguchi, Aichi (JP); Ken Furuta, Aichi (JP)

(73) Assignee: KITAGAWA INDUSTRIES CO., LTD., Inazawa-shi (JP)

( * ) Notice: Subject to any disclaimer, the term of this patent is extended or adjusted under 35 U.S.C. 154(b) by 534 days.

(21) Appl. No.: 13/879,891

(22) PCT Filed: Nov. 10, 2011

(86) PCT No.: PCT/JP2011/075947
§ 371 (c)(1),
(2), (4) Date: Apr. 17, 2013

(87) PCT Pub. No.: WO2012/063903
PCT Pub. Date: May 18, 2012

(65) Prior Publication Data
US 2013/0213703 A1    Aug. 22, 2013

(30) Foreign Application Priority Data

Nov. 11, 2010    (JP) .................. 2010-252810

(51) Int. Cl.
*B32B 3/00* (2006.01)
*H05K 3/06* (2006.01)
(Continued)

(52) U.S. Cl.
CPC ............ *H05K 3/067* (2013.01); *C23C 14/0042* (2013.01); *C23C 14/086* (2013.01); *G06F 3/041* (2013.01); *H05K 1/0306* (2013.01); *H05K 1/09* (2013.01); *Y10T 428/24802* (2015.01)

(58) Field of Classification Search
CPC ................ Y10T 428/24802; C23C 14/086; C23C 14/0042; H05K 1/09; H05K 1/067; H05K 1/0306

See application file for complete search history.

(56) References Cited

U.S. PATENT DOCUMENTS 8,895,427 B2 *  11/2014  Kuchiyama ............. G06F 3/041
                                                438/608

FOREIGN PATENT DOCUMENTS

CN       101276005 A      10/2008
JP       2001 291445      10/2001
(Continued)

OTHER PUBLICATIONS

Notification of Reasons for Refusal issued on Aug. 19, 2014 in the corresponding Japanese Patent Application No. 2010-252810 (with English Translation).

(Continued)

*Primary Examiner* — Elizabeth Mulvaney
(74) *Attorney, Agent, or Firm* — Oblon, McClelland, Maier & Neustadt, L.L.P

(57) ABSTRACT

A transparent conductive film 1 includes: a substrate film 11 composed of a transparent resin; a high refractive index coat layer 12 formed on a surface of the substrate film 11, and having an optical refractive index higher than that of the substrate film 11; a low refractive index coat layer 13 formed on a surface of the high refractive index coat layer 12, and having an optical refractive index lower than that of the high refractive index coat layer 12; a moisture-proof underlying layer 14 formed on a surface of the low refractive index coat layer 13 and composed of silicon oxide; and a transparent wiring layer 15 patterned on a surface of the underlying layer 14 and composed of crystalline ITO having an optical refractive index higher than the underlying layer 14. The crystallite size of ITO in the transparent wiring layer 15 is 9 nm or less.

4 Claims, 3 Drawing Sheets

(51) Int. Cl.
*C23C 14/00* (2006.01)
*C23C 14/08* (2006.01)
*G06F 3/041* (2006.01)
*H05K 1/03* (2006.01)
*H05K 1/09* (2006.01)

(56) References Cited

FOREIGN PATENT DOCUMENTS

| JP | 2003 136625 | 5/2003 |
|---|---|---|
| JP | 2008 98169 | 4/2008 |
| JP | 2010 23282 | 2/2010 |
| JP | 2010-27567 A | 2/2010 |
| JP | 2010-69675 A | 4/2010 |

OTHER PUBLICATIONS

International Search Report Issued Dec. 13, 2011 in PCT/JP11/75947 Filed Nov. 10, 2011.
Extended Search Report issued Apr. 28, 2015 in European Patent Application No. 11840168.6.
A. K. Kulkarni et al: "Dependence of the sheet resistance of indium—tin—oxide thin films on grain size and grain orientation determined from x-ray diffraction techniques", Thin Solid Films, Elsevier-Sequoia S.A. Lausanne, CH, vol. 345, No. 2, May 21, 1999, pp. 273-277, XP004177540.

* cited by examiner

TRANSPARENT CONDUCTIVE FILM

TECHNICAL FIELD

The present invention relates to a transparent conductive film used in a touch panel and the like.

BACKGROUND ART

As a transparent conductive film used in a touch panel, there is a film having, on one surface thereof, a transparent wiring layer formed by patterning a transparent conductive membrane.

In recent years, in a touch panel mounted onto a smart phone and the like, optical properties thereof have been improved. In other words, it has been required to keep color tones of images viewed through the touch panel, and to make the presence of its transparent wiring layer inconspicuous. Additionally, it is also required to make the transparent wiring layer finer in line width, and to have a high durability.

As a technique of ensuring the transparency of the transparent wiring layer to make the wiring inconspicuous, for example, a transparent conductive film having an optical adjustment layer formed between a substrate film and a transparent conductive membrane (transparent wiring layer) is suggested (Patent Documents 1 and 2).

As the transparent wiring layer, ITO (indium tin oxide) is used. From the viewpoint of the durability and optical properties of the transparent wiring layer, crystalline ITO is used.

PRIOR ART DOCUMENT

Patent Document

Patent Document 1 JP-A-2010-23282
Patent Document 2 JP-A-2008-98169

SUMMARY OF THE INVENTION

Problem to be Solved by the Invention

However, when patterning of the transparent wiring layer is conducted, the transparent conductive membrane is etched. The use of crystalline ITO in the transparent conductive membrane (transparent wiring layer) leads to deterioration in the etching property such as lowering of the etching rate, remaining etching residues, and the like. For, in particular, recent transparent conductive films in which their transparent wiring layer with finer line width is required as described above, a transparent conductive membrane excellent in etching property is desired. Thus, it is conceivable to form the transparent wiring layer to be composed of amorphous ITO. However, when using amorphous ITO, it is difficult to maintain the durability and optical properties of the transparent wiring layer.

The present invention has been made in view of these problems, and is intended to provide a transparent conductive film having a transparent wiring layer excellent in durability and optical properties and further capable of enhancing the wiring precision easily, and a production process thereof.

Means for Solving the Problem

A first aspect of the invention is a transparent conductive film, characterized by:

a substrate film composed of a transparent resin, a high refractive index coat layer formed on a surface of the substrate film, and having an optical refractive index higher than that of the substrate film, a low refractive index coat layer formed on a surface of the high refractive index coat layer, and having an optical refractive index lower than that of the high refractive index coat layer, a moisture-proof underlying layer formed on a surface of the low refractive index coat layer and composed of silicon oxide, and a transparent wiring layer patterned on a surface of the underlying layer and composed of crystalline ITO having an optical refractive index higher than that of the underlying layer, wherein the crystallite size of ITO in the transparent wiring layer is 9 nm or less.

A second aspect of the invention is a method for producing a transparent conductive film, characterized by:

forming, on a surface of a multilayer film on the side of a low refractive index coat layer, a moisture-proof underlying layer composed of silicon oxide, the multilayer film being comprised of a high refractive index coat layer formed on a surface of a substrate film composed of a transparent resin and having an optical refractive index higher than that of the substrate film, and the low refractive index coat layer formed on a surface of the high refractive index coat layer and having an optical refractive index lower than that of the high refractive index coat layer;

then forming, on a surface of the underlying layer, a transparent conductive membrane composed of amorphous ITO having an optical refractive index higher than that of the underlying layer;

then forming a transparent wiring layer by partially etching the transparent conductive membrane to be patterned; and then crystallizing the transparent wiring layer by annealing a laminated body comprised of the multilayer film, the underlying layer and the transparent wiring layer.

Effects of the Invention

In the transparent conductive film according to the first aspect of the invention, the high refractive index coat layer, the low refractive index coat layer and the underlying layer are provided in this lamination order between the substrate film and the transparent wiring layer.

Consequently, it is possible to increase light transmission in the transparent conductive film, which leads to improvement of optical properties thereof.

In the transparent wiring layer, the crystallite size of ITO is 9 nm or less. In other words, ITO composing the transparent wiring layer is crystallized but is in a state that the degree of the crystallization is low. Hereinafter, this state is to be referred to as "microcrystalline" or "microcrystal".

Even if the transparent wiring layer is in the microcrystalline state, it is not different than crystalline. Accordingly, the transparent wiring layer can keep its durability and its optical properties. Specifically, when the transparent conductive film is used for, e.g., a touch panel, the panel is excellent in key-touch property and sliding property and can keep its light transmittance high.

Since the transparent wiring layer is in the microcrystalline state, a transparent wiring layer to be subjected to heat treatment (annealing) can be kept in an amorphous state (noncrystalline) after deposition. Specifically, in the case of depositing the transparent conductive membrane followed by etching this membrane partially to be converted to the transparent wiring layer and subsequently annealing the transparent wiring layer to be crystallized, ITO needs to be crystalline to some extent even before annealed to make the degree of the crystallization of ITO after annealed higher than the above-mentioned microcrystalline state. Meanwhile, even if ITO is noncrystalline (amorphous) before annealed, it is possible to realize the crystallization of ITO up to the extent of microcrystalline state by annealing.

Therefore, under the condition that the annealed ITO is at a level of the microcrystal, etching can be applied to the transparent conductive membrane before the transparent wiring layer is crystallized, i.e., can be applied to the membrane in the amorphous state. Consequently, the precision of the wiring-formation by the etching can be raised, thus improving the precision of the wiring.

Because the transparent conductive membrane is formed on a surface of the underlying layer composed of silicon oxide, it is possible to promote the crystallization of ITO in the annealing.

In the method for producing a transparent conductive film according to the second aspect of the invention, the underlying layer is formed on a surface of the multilayer film on the side of the low refractive index coat layer. Therefore, it is possible to promote the crystallization of ITO in the annealing.

The transparent conductive membrane composed of amorphous ITO is formed on a surface of the underlying layer. Next, the transparent conductive membrane is partially etched to be patterned so as to form the transparent wiring layer. That is to say, the transparent conductive membrane composed of amorphous ITO having excellent etching property, is etched; therefore, the patterning can be easily and precisely conducted. As a result, for example, the transparent wiring layer is easily made fine in line width. Thus, the wiring precision can be improved.

Thereafter, the laminated body is annealed to crystallize the transparent wiring layer so that the transparent wiring layer can ensure durability and optical properties.

As described above, the invention can provide a transparent conductive film having a transparent wiring layer excellent in durability and optical properties and further capable of improving the wiring precision easily, and a method for producing the same.

MODE FOR CARRYING OUT THE INVENTION

Figure 1:
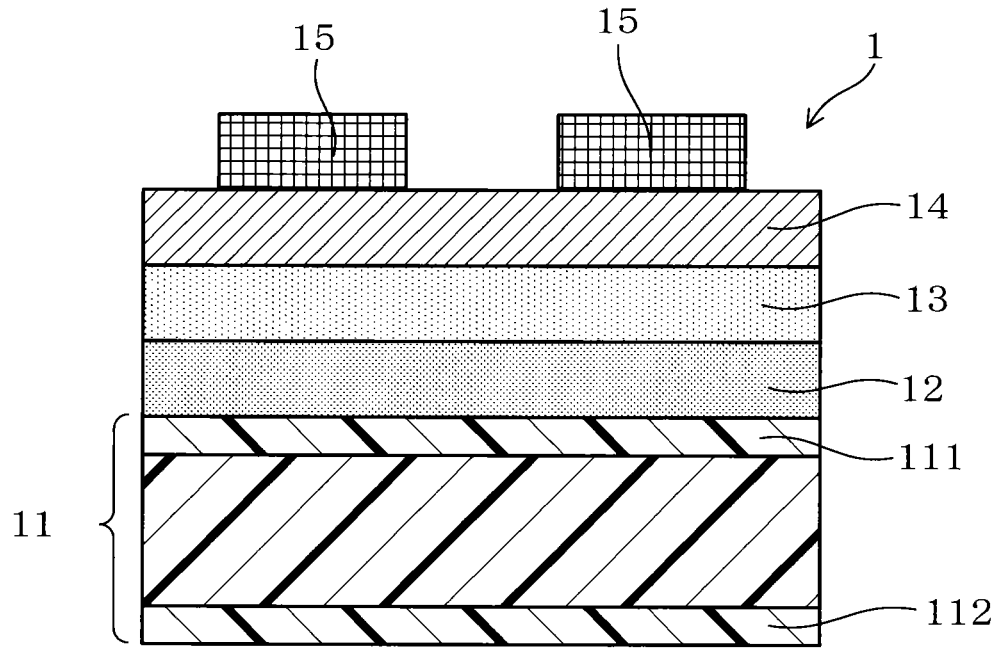
FIG. 1 is a cross-sectional view of a transparent conductive film in Example 1.

The transparent conductive film according to the first aspect of the invention is used in, for example, a touch panel in an electrostatic capacity mode or resistance film mode.

The above-mentioned substrate film may be composed of a flexible film of, e.g., polyethylene terephthalate (PET), polyethylene naphthalate (PEN), polyethersulfone (PES), polyetheretherketone (PEEK), polycarbonate (PC), polypropylene (PP), polyamide (PA), polyacryl (PAC), an epoxy resin, a phenolic resin, an alicyclic polyolefin, or a norbornene based thermoplastic transparent resin; or a laminate of two or more thereof. The substrate film may comprise hard coat layers on front and rear surfaces thereof.

The high refractive index coat layer may be composed of, e.g., zinc oxide, titanium oxide, cerium oxide, aluminum oxide, antimony oxide, zirconium oxide, tin oxide, niobium oxide, lanthanum oxide, aluminum oxide, tin oxide, or ITO, and its optical refractive index may be set in the range of 1.7 to 2.8. The film thickness of the high refractive index coat layer may be set in the range of, e.g., 5 to 50 nm.

The low refractive index coat layer may be composed of, e.g., silicon oxide, calcium fluoride, or magnesium fluoride, and its optical refractive index may be set in the range of 1.2 to 1.5. The film thickness of the low refractive index coat layer may be set in the range of, e.g., 10 to 100 nm.

The optical refractive index of the underlying layer may be set in the range of, e.g., 1.4 to 1.5; and the film thickness thereof, in the range of 10 to 20 nm. The optical refractive index of the transparent wiring layer may be set in the range of, e.g., 1.9 to 2.2, and its film thickness may be set in the range from 18 to 30 nm.

Preferably, the underlying layer and the transparent wiring layer (transparent conductive membrane) are deposited by sputtering.

In the second aspect of the invention, the crystallite size of ITO in the annealed transparent wiring layer is preferably 9 nm or less.

In this case, the transparent wiring layer which has the capability of enhancing the wiring precision easily as well as excellent durability and optical properties can be certainly obtained.

In a case that the crystallite size exceeds 9 nm, it is difficult to keep ITO in the unannealed transparent wiring layer (transparent conductive membrane) in the amorphous state. This critical significance is applicable to the crystallite size of ITO in the transparent wiring layer in the transparent conductive film according to the first aspect of the invention.

The degree of the crystallization (the crystallite size of ITO) of the annealed transparent wiring layer can be adjusted by means of deposition conditions in depositing the transparent wiring layer (transparent conductive membrane). For example, when the transparent wiring layer (transparent conductive membrane) is deposited by sputtering, the degree of the crystallization of the annealed transparent wiring layer is adjustable by regulating the pressure of a mixed gas of argon and oxygen in the chamber, and the partial pressure of oxygen therein (see Experimental Example 1).

EMBODIMENT

Example 1

A description will be made about a transparent conductive film according to an example of the invention, and a method for producing the same, referring to FIGS. 1 to 4.

As illustrated in FIG. 1, the transparent conductive film 1 of the present example has a substrate film 11 composed of a transparent resin, a high refractive index coat layer 12 formed on a surface of the substrate film 11 and having an optical refractive index higher than that of the substrate film 11, and a low refractive index coat layer 13 formed on a surface of the high refractive index coat layer 12 and having an optical refractive index lower than that of the high refractive index coat layer 12. Furthermore, the transparent conductive film 1 has a moisture-proof underlying layer 14 formed on a surface of the low refractive index coat layer 13 and composed of silicon oxide, and a transparent wiring layer 15 patterned on a surface of the underlying layer 14 and composed of ITO having an optical refractive index higher than that of the underlying layer 14.

As for the transparent wiring layer 15, the crystallite size of ITO is 9 nm or less.

In other words, ITO constituting the transparent wiring layer 15 is crystalline, and is in a state that the degree of the crystallization thereof is low (microcrystalline state).

In the present example, the substrate film 11 has hard coat layers 111 and 112 on its front and rear surfaces.

The substrate film 11 is composed of PET (polyethylene terephthalate), and has an optical refractive index of 1.4 to 1.7. The substrate film 11 has a thickness of 25 to 188 μm. The hard coat layers 111 and 112 each have a thickness of 3 to 8 μm.

The high refractive index coat layer 12 may be composed of, e.g., zinc oxide, titanium oxide, cerium oxide, aluminum oxide, antimony oxide, zirconium oxide, tin oxide, niobium oxide, lanthanum oxide, or ITO, and its optical refractive index is from 1.7 to 2.8. The film thickness of the high refractive index coat layer 12 may be defined in the range of 5 to 50 nm.

The low refractive index coat layer 13 may be composed of, e.g., silicon oxide, calcium fluoride, or magnesium fluoride, and its optical refractive index is from 1.2 to 1.5. The film thickness of the low refractive index coat layer 13 may be set in the range of 10 to 100 nm.

The underlying layer 14 has an optical refractive index of 1.4 to 1.5, and a film thickness of 10 to 20 nm. The transparent wiring layer 15 has an optical refractive index of 1.9 to 2.2, and its film thickness may be set in the range of 18 to 30 nm.

The transparent wiring layer 15 may be configured to have, for example, a pattern of plural linear wirings parallel to each other.

The transparent conductive film 1 of the present example may be used in a touch panel. In the case, two transparent conductive films 1 are superimposed in such a manner that their transparent wiring layers 15 are faced to each other with a predetermined interval therebetween.

Figure 2:
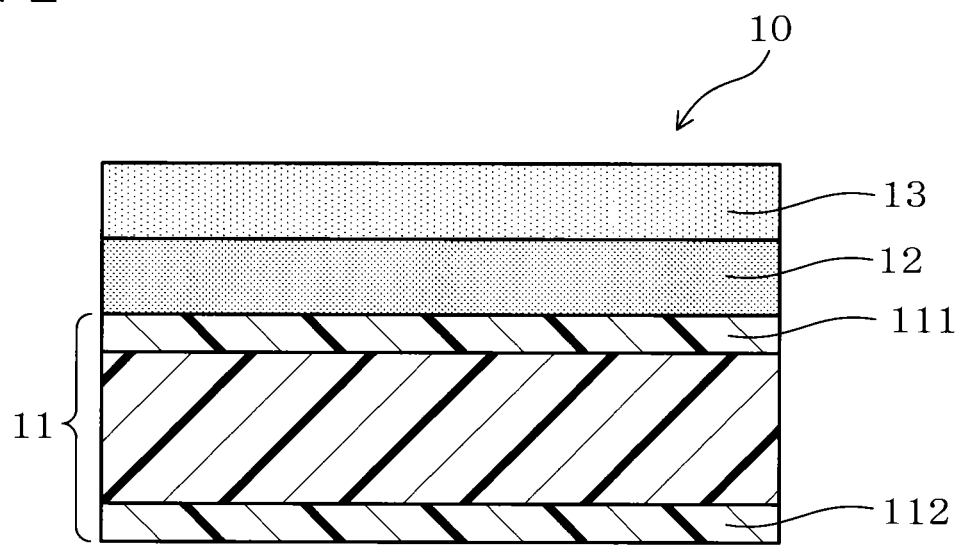
FIG. 2 is a cross-sectional view of a multilayer film in Example 1.

In the production of the above-described transparent conductive film 1, first, a multilayer film 10 composed of resins as illustrated in FIG. 2 is prepared. The multilayer film 10 is a film in which a high refractive index coat layer 12 and a low refractive index coat layer 13 are formed in this order on a surface of a substrate film 11.

Figure 3:
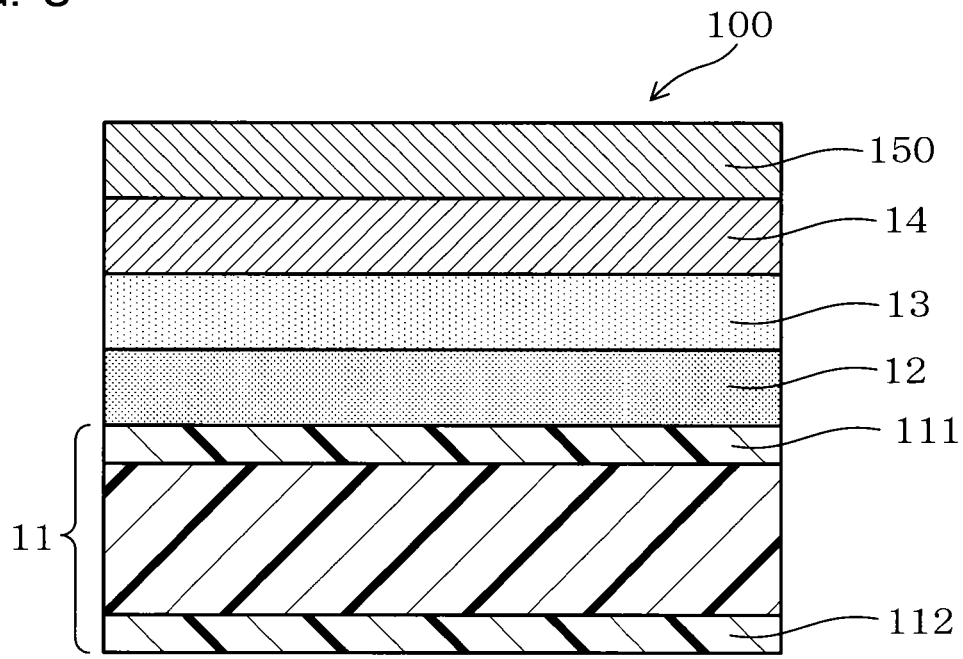
FIG. 3 is a cross-sectional view of a state in which an underlying layer and an amorphous transparent conductive membrane are formed on the multilayer film in Example 1.

As illustrated in FIG. 3, an underlying layer 14 composed of silicon oxide is formed on a surface of this multilayer film 10 on the side of the low refractive index coat layer 13.

A transparent conductive membrane 150 composed of amorphous ITO is then formed on the entire surface of the underlying layer 14.

Figure 4:
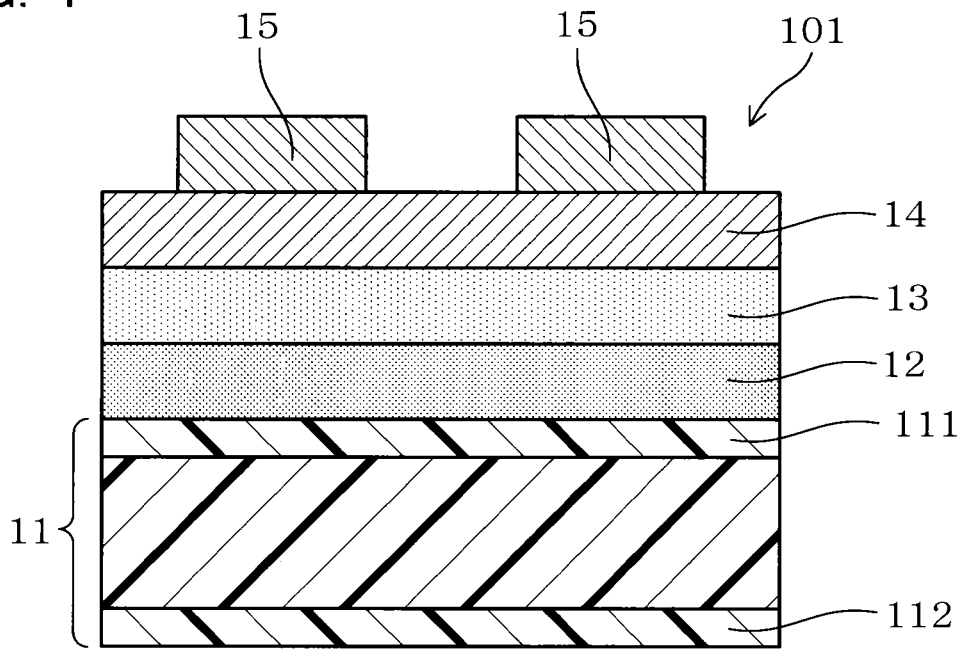
FIG. 4 is a cross-sectional view of an amorphous transparent wiring layer formed just after etching the transparent conductive membrane in Example 1.

Then, as illustrated in FIG. 4, the transparent conductive membrane 150 is partially etched to be patterned, thus forming a transparent wiring layer 15.

Then, a laminated body 101 composed of the multilayer film 10, the underlying layer 14 and the transparent wiring layer 15 is annealed to crystallize the transparent wiring layer 15 (FIG. 1).

The following will describe an example of a method for forming the underlying layer 14 and the transparent conductive membrane 150.

For the deposition, a magnetron sputtering machine in a roll-to-roll manner is used. The multilayer film 10 is set in a chamber of the sputtering equipment. A silicon target (manufactured by Sumitomo Metal Mining Co., Ltd.) is put into one of plural cathodes mounted in the chamber; and an ITO target (manufactured by Sumitomo Metal Mining Co., Ltd.), into another of the cathodes.

The chamber is divided into two spaces. The silicon target is located inside one of the spaces, and the ITO target is located inside the other space.

Then, the chamber in which the multilayer film 10 is placed is evacuated to set the vacuum degree therein in the range of about $1\times10^{-3}$ to $1\times10^{-5}$ Pa.

Then, a mixed gas of argon (Ar) and oxygen ($O_2$) is introduced into the chamber, and the pressure therein is set in the range of 0.3 to 0.6 Pa. At this time, for the mixed gas introduced into the space in which the silicon target is located inside the chamber, the quantity of oxygen ($O_2$) is adjusted to set the discharge voltage of the cathode to a predetermined discharge voltage. On the other hand, for the mixed gas introduced separately into the space in which the ITO target is located, the proportion of oxygen to argon (the ratio of the oxygen partial pressure to the argon partial pressure) was set in the range of 3 to 6%.

In this state, a voltage is appropriately applied to electrodes of the sputtering machine to deposit silicon oxide and ITO in turn onto the surface (on the side of the low refractive index coat layer 13 side surface) of the multilayer film 10.

As illustrated in FIG. 3, this process gives a laminated body 100 having the underlying layer 14 and the amorphous transparent conductive membrane 150 formed on the surface of the multilayer film 10 composed of the substrate film 11, the high refractive index coat layer 12 and the low refractive index coat layer 13.

Then, the laminated body 100 is taken out from the chamber, and the amorphous transparent conductive membrane 150 is partially etched to be patterned. An etching solution used here is, for example, HCL (hydrochloric acid). In this way, a transparent wiring layer 15 composed of amorphous ITO is formed, as illustrated in FIG. 4.

Then, a laminated body 101 having the transparent wiring layer 15 formed thereon is annealed, for example, at 150° C. for 90 minutes. Thus, amorphous ITO in the transparent wiring layer 15 is crystallized. The degree of the crystallization at this time is such a microcrystal degree that the X-ray diffraction peak intensity is 200 cps or less.

As described above, the transparent conductive film 1 of the present example can be obtained.

The following will describe the effect and advantages of the present example.

In the transparent conductive film 1, the high refractive index coat layer 12, the low refractive index coat layer 13, and the underlying layer 14 are provided in the above-mentioned lamination order between the substrate film 11 and the transparent wiring layer 15. In this manner, it is possible to increase the light transmission in the transparent conductive film 1, which leads to improvement of optical properties thereof.

In the transparent wiring layer 15, the crystallite size of ITO is 9 nm or less. In other words, ITO composing the transparent wiring layer 15 is crystallized but is in a state that the degree of the crystallization is low (microcrystalline state).

Even if the transparent wiring layer 15 is in the microcrystalline state, it is not different than crystalline. Accordingly, the transparent wiring layer 15 can keep durability and optical properties. Specifically, when the transparent conductive film 1 is used for a touch panel, the panel is excellent in key-touch property and sliding property and can further keep high light transmittance.

Since the transparent wiring layer 15 is in the microcrystalline state, a transparent wiring layer 15 to be subjected to heat treatment (annealing) can be kept in the amorphous state (noncrystalline) after deposition. Specifically, in the case of depositing the transparent conductive membrane 150 followed by etching this membrane partially to be converted to the transparent wiring layer 15 and subsequently annealing the layer 15 to be crystallized, ITO needs to be crystalline to some extent even before annealed to make the degree of the crystallization of ITO after annealed higher than the above-mentioned microcrystalline state. Meanwhile, even if ITO is noncrystalline (amorphous) before annealed, it is possible to realize the crystallization of ITO up to the extent of microcrystalline state by annealing.

Therefore, under the condition that the annealed ITO is at a level of the microcrystal, etching can be applied to the transparent conductive membrane 150 before the transparent wiring layer 15 is crystallized, i.e., can be applied to the membrane 150 in the amorphous state. Consequently, the precision of the wiring-formation by the etching can be raised, thus improving the precision of the wiring.

Because the transparent conductive membrane is formed on a surface of the underlying layer composed of silicon oxide, it is possible to promote the crystallization of ITO in the annealing.

In the method for producing a transparent conductive film according to the present example, the transparent conductive membrane 150 composed of amorphous ITO is formed on a surface of the underlying layer 14. Next, the transparent conductive membrane 150 is partially etched to be patterned to form the transparent wiring layer 15. That is to say, the transparent conductive membrane 150 composed of amorphous ITO having excellent etching property, is etched; therefore, the patterning can be easily and precisely conducted. As a result, for example, the transparent wiring layer 15 is easily made fine in line width. Thus, the wiring precision can be improved.

Thereafter, the laminated body 101 is annealed to crystallize the transparent wiring layer 15 so that the transparent wiring layer 15 can ensure durability and optical properties.

As described above, the invention can provide a transparent conductive film having a transparent wiring layer excellent in durability and optical properties and further capable of improving the wiring precision easily, and a method for producing the same.

Experimental Example 1

Figure 5:
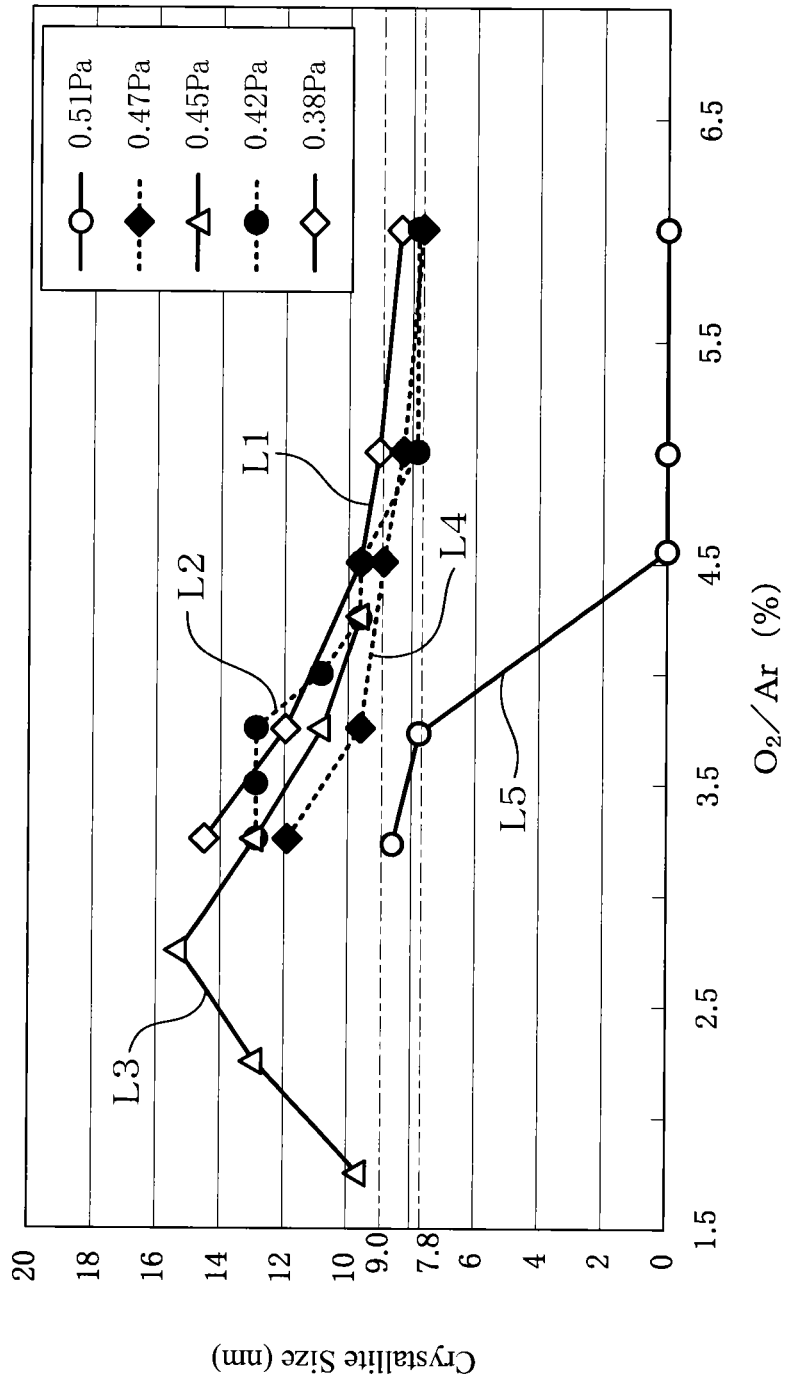
FIG. 5 is a diagram showing a relationship between deposition condition during sputtering and crystallite size of ITO in transparent wiring layers in Experimental Example 1.

As shown in FIG. 5 and Table 1, the present example is an example of investigation in which a relationship between sputtering conditions during the deposition of the transparent conductive membrane 150 and the degree of the crystallization of the transparent wiring layer 15 resulted from the subsequent annealing in the method for producing a transparent conductive film as described in Example 1, was examined.

With respect to the sputtering conditions, the pressure of the mixed gas of argon (Ar) and oxygen ($O_2$) to be introduced into the chamber, and the proportion of oxygen to argon (the ratio of the oxygen partial pressure to the argon partial pressure ($O_2$/Ar)) in the mixed gas were variously changed. Transparent conductive membranes 150 corresponding to the various conditions were deposited respectively, and then etched to be patterned to as to form transparent wiring layers 15, and they were annealed at 150° C. for 90 minutes to be crystallized, thus preparing transparent conductive films 1.

The vacuum degree in the chamber during sputtering was set to $1\times10^{-3}$ Pa.

The used sputtering machine was a magnetron sputtering machine in a roll-to-roll manner.

For the resultant various transparent conductive films 1, the crystallite size of ITO in their transparent wiring layer 15 was measured.

The crystallite size of ITO was obtained by means of an X-ray diffraction method. Specifically, the size was obtained from an ITO (220) diffraction peak according to X-ray diffraction of the thin film by the Scherrer method. The Scherrer method is a technique of measuring using a relationship represented by $t=0.9\lambda/B \cos \theta$ wherein $\lambda$ [nm], $\theta$ [rad], t [nm] and B [rad] representing, respectively, the used wavelength of the X-ray, the diffraction angle, the crystallite size, and the width (half band width) of the diffraction line. In the measurement, an X-ray diffraction machine (RINT-2100) manufactured by Rigaku Corp. was used. An X-ray source thereof is CuKα (40 kV, 40 mA).

The measured crystallite sizes are shown in FIG. 5. In this figure, data connected through a curve L1 are obtained under the condition that the pressure of the mixed gas during the sputtering was set to be 0.38 Pa; data connected through a curve L2 are obtained under the condition that the aforesaid pressure was set to be 0.42 Pa; data connected through a curve L3 are obtained under the condition that the aforesaid pressure was set to be 0.45 Pa; data connected through a curve L4 are obtained under the condition that the aforesaid pressure was set to be 0.47 Pa; and data connected through a curve L5 are obtained under the condition that the aforesaid pressure was set to be 0.51 Pa.

The transverse axis of FIG. 5 represents the ratio of the oxygen partial pressure to the argon partial pressure ($O_2$/Ar); and the vertical axis represents the crystallite size.

As is understood from FIG. 5, by regulating the pressure of the mixed gas, and the ratio of the oxygen partial pressure to the argon partial pressure during the sputtering, the crystallite size of ITO is adjustable to 9 nm or less. Specifically, the crystallite size of ITO is adjustable to 9 nm or less, for example, by regulating the mixed gas to have an oxygen/argon proportion of 3.25% while to have a pressure of 0.51 Pa, or to have an oxygen/argon proportion of 6% while to have a pressure of 0.38 Pa. The layers 15 having a crystallite size more than 9 nm after annealing were crystallized before annealed. On the other hand, the layers 15 having a crystallite size of 9 nm or less after the annealing were in an amorphous state before annealing.

Then, for the transparent wiring layers 15 (transparent conductive membranes 150) deposited under the various conditions, respective color tones (b* values in the L*a*b* color space) and etching property thereof were evaluated. The samples for evaluation were picked up among the various samples from which the data shown in FIG. 5 were obtained. The conditions for sputtering and so on are as shown in Table 1 below. However, samples 6, 9 and 10 were prepared by depositing the transparent conductive membrane 150 under the condition that the ultimate vacuum in the chamber was adjusted to $1\times10^{-4}$ Pa or $1\times10^{-5}$ Pa.

The b* value is the value of the region provided with the transparent wiring layer 15, which is presented in the case where the b* value of the region not provided with the transparent wiring layer 15 is set to be 1.0. Thus, the transparent wiring layer 15 is more conspicuous as the b* value is more largely shifted from 1.0. The b* value was measured in accordance with JIS Z 8722, using a colorimeter "Colour Cute i" manufactured by Suga Test Instruments Co., Ltd.

The etching property was evaluated in the state that the transparent conductive membrane 150 was etched to be patterned, as follows: the film was judged to be nondefective (○)

when the film had no etching residue while judged to be defective (x) when the film had an etching residue.

The crystallite size of the transparent conductive membrane 150 before annealing was also measured. In Table 1, the symbol "-" shows that the corresponding film 150 was not crystallized.

in durability and optical properties and further capable of enhancing the wiring precision easily. It is understood that this film can ensure the excellent durability and optical properties, and the enhancement of the wiring precision, in particular, so long as the crystallite size of ITO in the transparent wiring layer is 7.8 to 9 nm.

TABLE 1

| Samples | Crystallite Size (nm) | b *Value | $O_2$/Ar (%) | Pressure (Pa) | Ultimate Vacuum (Pa) | Etching Property | Key Touch Property | Crystallite Size (nm) Before Annealed |
|---|---|---|---|---|---|---|---|---|
| 0 | — | 2.0 | 4.55 | 0.51 | $1 \times 10^{-3}$ | ○ | X | — |
| 1 | 7.8 | 1.0 | 6 | 0.42 | $1 \times 10^{-3}$ | ○ | ○ | — |
| 2 | 8.2 | 1.0 | 5 | 0.47 | $1 \times 10^{-3}$ | ○ | ○ | — |
| 3 | 8.4 | 1.0 | 6 | 0.38 | $1 \times 10^{-3}$ | ○ | ○ | — |
| 4 | 8.6 | 1.0 | 3.25 | 0.51 | $1 \times 10^{-3}$ | ○ | ○ | — |
| 5 | 8.9 | 1.0 | 4.5 | 0.47 | $1 \times 10^{-3}$ | ○ | ○ | — |
| 6 | 9.0 | 1.0 | 3.25 | 0.51 | $1 \times 10^{-4}$ | ○ | ○ | — |
| 7 | 14.5 | 0.9 | 3.25 | 0.38 | $1 \times 10^{-3}$ | X | ○ | 7.6 |
| 8 | 15.3 | 0.9 | 2.75 | 0.45 | $1 \times 10^{-3}$ | X | ○ | 7.7 |
| 9 | 10.2 | 0.9 | 3.25 | 0.51 | $1 \times 10^{-4}$ | X | ○ | 7.1 |
| 10 | 16.8 | 0.7 | 3.25 | 0.38 | $1 \times 10^{-5}$ | X | ○ | 9.0 |

As shown in Table 1, the samples (samples 1-6) in which the crystallite size of ITO in their transparent wiring layer 15 was 9 nm or less were excellent in etching property. By contrast, the samples (samples 7-10) in which the crystallite size of ITO in their transparent wiring layer 15 was more than 9 nm were poor in etching property. Sample 0 was prepared which was not annealed to keep the transparent wiring layer in an amorphous state. This sample was poor in key-touch property although excellent in etching property.

It was verified that the samples in which the crystallite size of ITO in their annealed transparent wiring layer 15 was 9 nm or less were amorphous because no X-ray diffraction peak resulting from ITO was detected before annealed. By contrast, the samples in which the crystallite size of ITO in their annealed transparent wiring layer 15 was more than 9 nm were not amorphous because an X-ray diffraction peak intensity of their transparent conductive membrane 150 was detected before annealed. It is considered that this made the membrane 150 inferior in etching property.

With respect to each of samples 1 to 6, the acid resistance of the transparent wiring layer 15 of the transparent conductive film 1 was checked. In the evaluating method, the transparent conductive film 1 was immersed in 5% HCl (hydrochloric acid) of 25° C. for 30 minutes. The check was made in accordance with whether or not the resistance change over this period was 20% or less. As a result, each of samples 1 to 6 showed a resistance change of 20% or less and no problem about the acid resistance was verified.

Furthermore, the key-touch property was evaluated on each of the samples. The key-touch property is evaluated as follows: after subjected to a key-touch test of touching the key 1,000,000 times, the sample was judged to be nondefective (○) when the change ratio of the resistance value thereof was 20% or less while judged to be defective (x) when the ratio was more than 20%. As is understood from Table 1, sample 0 having the transparent wiring layer not crystallized was insufficient in key-touch property. Samples 1 to 10 each having the crystallized transparent wiring layer were excellent in key-touch property.

From the above-described results, it is understood that when a transparent wiring layer has crystallized ITO and a crystallite size of 9 nm or less, a transparent conductive film can be obtained which has a transparent wiring layer excellent

The invention claimed is:

1. A transparent conductive film, comprising:
   a substrate film comprising a transparent resin;
   a high refractive index coat layer formed on a surface of the substrate film, the high refractive index coat layer having an optical refractive index that is higher than that of the substrate film;
   a low refractive index coat layer formed on a surface of the high refractive index coat layer, the low refractive index coat layer having an optical refractive index that is lower than that of the high refractive index coat layer;
   a moisture-proof underlying layer formed on a surface of the low refractive index coat layer and comprising silicon oxide; and
   a transparent wiring layer patterned on a surface of the underlying layer and comprising crystalline ITO having an optical refractive index that is higher than that of the underlying layer, wherein
   a crystallite size of ITO in the transparent wiring layer is in the range of 7.8 nm to 9 nm.

2. A method for producing a transparent conductive film, the method comprising:
   forming, on a surface of a multilayer film on the side of a low refractive index coat layer, a moisture-proof underlying layer comprising silicon oxide, the multilayer film comprising a high refractive index coat layer formed on a surface of a substrate film comprising a transparent resin and the high refractive index coat layer having an optical refractive index that is higher than that of the substrate film, and the low refractive index coat layer formed on a surface of the high refractive index coat layer and the low refractive index coat layer having an optical refractive index that is lower than that of the high refractive index coat layer;
   then forming, on a surface of the underlying layer, a transparent conductive membrane comprising amorphous ITO having an optical refractive index that is higher than that of the underlying layer;
   then forming a transparent wiring layer by partially etching the transparent conductive membrane to be patterned; and
   then crystallizing the transparent wiring layer by annealing a laminated body comprised of the multilayer film, the underlying layer and the transparent wiring layer, wherein a crystallite size of ITO in the annealed transparent wiring layer is in the range from 7.8 nm to 9 nm.

3. The transparent conductive film according to claim 1, wherein a film thickness of the transparent wiring layer is in the range from 18 nm to 30 nm.

4. The method for producing a transparent conductive film according to claim 2, wherein a film thickness of the transparent wiring layer is in the range from 18 nm to 30 nm.

* * * * *